United States Patent
Beitelmal et al.

(10) Patent No.: US 6,862,179 B2
(45) Date of Patent: Mar. 1, 2005

(54) PARTITION FOR VARYING THE SUPPLY OF COOLING FLUID

(75) Inventors: Abdlmonem H. Beitelmal, Sacramento, CA (US); Chandrakant D. Patel, Fremont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 140 days.

(21) Appl. No.: 10/303,761

(22) Filed: Nov. 26, 2002

(65) Prior Publication Data

US 2004/0109288 A1 Jun. 10, 2004

(51) Int. Cl.[7] ................................................. G06F 1/16
(52) U.S. Cl. ...................... 361/687; 62/259.2; 454/195; 361/697
(58) Field of Search ................................. 361/679–687, 361/724–727, 695–697; 62/259.2, 186, 192, 81; 454/195; 312/223.1–223.3

(56) References Cited

U.S. PATENT DOCUMENTS

| | | | |
|---|---|---|---|
| 5,177,666 A | * 1/1993 | Bland et al. ................ | 361/689 |
| 5,209,073 A | 5/1993 | Thomas et al. ................ | 62/81 |
| 5,377,498 A | 1/1995 | Cur et al. ...................... | 62/197 |
| 5,899,083 A | 5/1999 | Peterson et al. .............. | 62/186 |
| 6,079,626 A | 6/2000 | Hartman ....................... | 236/13 |
| 6,305,180 B1 | * 10/2001 | Miller et al. ................ | 62/259.2 |
| 6,402,613 B1 | 6/2002 | Teagle .......................... | 454/195 |
| 6,668,565 B1 | * 12/2003 | Johnson et al. ................ | 62/89 |
| 6,694,759 B1 | * 2/2004 | Bash et al. .................... | 62/180 |

* cited by examiner

*Primary Examiner*—Hung Van Duong

(57) ABSTRACT

In a data center, a plurality of racks are cooled by activating a cooling device and opening a controllable partition configured to vary a supply of cooling fluid within a zone of the data center. The zone includes at least one associated rack of the plurality of racks. In addition, the temperature of at least one associated rack is sensed and it is determined whether the sensed temperature is within a predetermined temperature range. Furthermore, the controllable partition is manipulated to vary the supply of the cooling fluid to the zone in response to the sensed temperature being outside the predetermined temperature range.

41 Claims, 8 Drawing Sheets

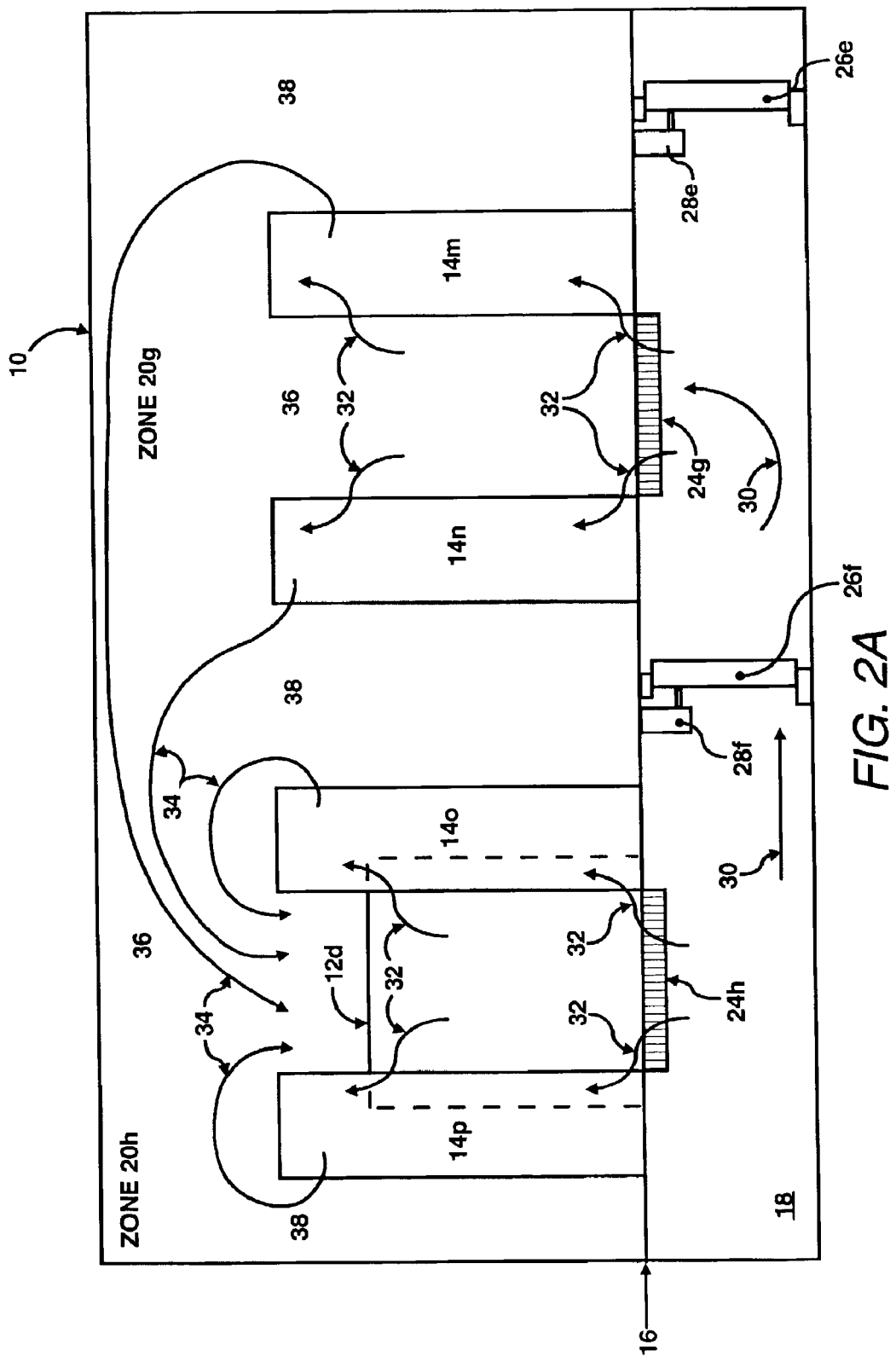

PARTITION FOR VARYING THE SUPPLY OF COOLING FLUID

BACKGROUND

A data center may be defined as a location, e.g., room, that houses numerous printed circuit (PC) board electronic systems arranged in a number of racks. A standard rack may be defined as an Electronics Industry Association (EIA) enclosure, 78 in. (2 meters) wide, 24 in. (0.61 meter) wide and 30 in. (0.76 meter) deep. Standard racks may be configured to house a number of PC boards, e.g., about forty (40) boards, with future configurations of racks being designed to accommodate up to eighty (80) boards. The PC boards typically include a number of components, e.g., processors, micro-controllers, high speed video cards, memories, semi-conductor devices, and the like, that dissipate relatively significant amounts of heat during the operation of the respective components. For example, a typical PC board comprising multiple microprocessors may dissipate approximately 250 W of power. Thus, a rack containing forty (40) PC boards of this type may dissipate approximately 10 KW of power.

The power required to remove the heat dissipated by the components in the racks is generally equal to about 10 percent of the power needed to operate the components. However, the power required to remove the heat dissipated by a plurality of racks in a data center is generally equal to about 50 percent of the power needed to operate the components in the racks. The disparity in the amount of power required to dissipate the various heat loads between racks and data centers stems from, for example, the additional thermodynamic work needed in the data center to cool the air. In one respect, racks are typically cooled with fans that operate to move cooling fluid, e.g., air, across the heat dissipating components; whereas, data centers often implement reverse power cycles to cool heated return air. The additional work required to achieve the temperature reduction, in addition to the work associated with moving the cooling fluid in the data center and the condenser, often add up to the 50 percent power requirement. As such, the cooling of data centers presents problems in addition to those faced with the cooling of racks.

Conventional data centers are typically cooled by operation of one or more air conditioning units. The compressors of the air conditioning units typically require a minimum of about thirty (30) percent of the required cooling capacity to sufficiently cool the data centers. The other components, e.g., air movers (fans), etc., typically require an additional twenty (20) percent of the required cooling capacity. As an example, a high density data center with 100 racks, each rack having a maximum power dissipation of 10 KW, generally requires 1 MW of cooling capacity. Air conditioning units with a capacity of 1 MW of heat removal generally requires a minimum of 300 KW input compressor power in addition to the power needed to drive the air moving devices, e.g., fans, blowers, etc. Conventional data center air conditioning units do not vary their cooling fluid output based on the distributed needs of the data center. Instead, these air conditioning units generally operate at or near a maximum compressor power even when the heat load is reduced inside the data center.

The substantially continuous operation of the air conditioning units is generally designed to operate according to a worst-case scenario. That is, cooling fluid is supplied to the components at around 100 percent of the estimated cooling requirement. In this respect, conventional cooling systems often attempt to cool components that may not be operating at a level which may cause its temperature to exceed a predetermined temperature range. In addition, conventional cooling systems generally supply cooling fluid to the components in an inefficient manner and substantially indiscriminate manner. That is, conventional cooling systems typically have plenums which may not vary the volume flow of cooling fluid according to fluctuations in the cooling requirements. Consequently, conventional cooling systems often incur greater amounts of operating expenses than may be necessary to sufficiently cool the heat generating components contained in the racks of data centers.

SUMMARY

According to one embodiment, the invention pertains to a method of cooling a plurality of racks in a data center. In this method, a cooling device is activated and a controllable partition configured to vary a supply of cooling fluid within a zone of the data center is opened. The zone includes at least one associated rack of the plurality of racks. In addition, the temperature of at least one associated rack is sensed and it is determined whether the sensed temperature is within a predetermined temperature range. Furthermore, the controllable partition is manipulated to vary the supply of the cooling fluid to the zone in response to the sensed temperature being outside the predetermined temperature range.

BRIEF DESCRIPTION OF THE DRAWINGS

Embodiments of the invention are illustrated by way of example and not limitation in the accompanying figures in which like numeral references refer to like elements, and wherein:

FIG. 2A shows a simplified schematic cross-sectional side view along lines IIA—IIA of FIG. 1 in accordance with an embodiment of the invention;

DETAILED DESCRIPTION

For simplicity and illustrative purposes, the principles of the invention are described by referring mainly to an embodiment thereof. In the following description, numerous specific details are set forth in order to provide a thorough understanding of the invention. It will be apparent however, to one of ordinary skill in the art, that the invention may be practiced without limitation to these specific details. In other instances, well known methods and structures have not been described in detail so as not to unnecessarily obscure the invention.

According to an embodiment of the invention, a cooling system is configured to adjust cooling fluid (e.g., air, other gasses, liquid, etc.) flow to and/or from various racks located throughout a data center, e.g., a location that houses numerous printed circuit (PC) board electronic systems arranged in a number of racks, based upon the detected or anticipated temperatures at various locations throughout the data center. In one respect, by substantially increasing the cooling fluid flow to those racks dissipating greater amounts of heat and by substantially decreasing the cooling fluid flow to and/or from those racks dissipating lesser amounts of heat, the amount of energy required to operate the cooling system may be relatively reduced.

More specifically, by modifying the volume flow rate of cooling fluid from a plenum (e.g., supply plenum, return plenum, etc.) of the cooling system, an area of the data center may receive cooling capacity commensurate with the heat load dissipated within that area. In this regard, the volume flow rate of the cooling fluid is dependent upon the cross sectional area through which the fluid is flowing and the forces of pressure being exerted upon the fluid. Furthermore, by dynamically controlling the flow of cooling fluid with respect to the plenum (e.g., into, within, and out of), the ability to respond to various cooling demands may be maintained. Thus, instead of operating the devices, e.g., compressors, fans, etc., of the cooling system at substantially 100 percent of the anticipated heat dissipation from the racks, those devices may be operated in a more efficient manner. In addition, the racks may be positioned throughout the data center according to their anticipated heat loads to thereby enable computer room air conditioning (CRAC) units located at various positions throughout the data center to operate in a more efficient manner. In another respect, the positioning of the racks may be determined through implementation of modeling and metrology of the cooling fluid flow throughout the data center. In addition, the numerical modeling may be implemented to determine the volume flow rate and velocity of the cooling fluid flow through each of the one or more plenums. Furthermore, the numerical modeling may be implemented to determine the volume flow rate and velocity of the cooling fluid flow through supply and/or return vents.

Figure 1:
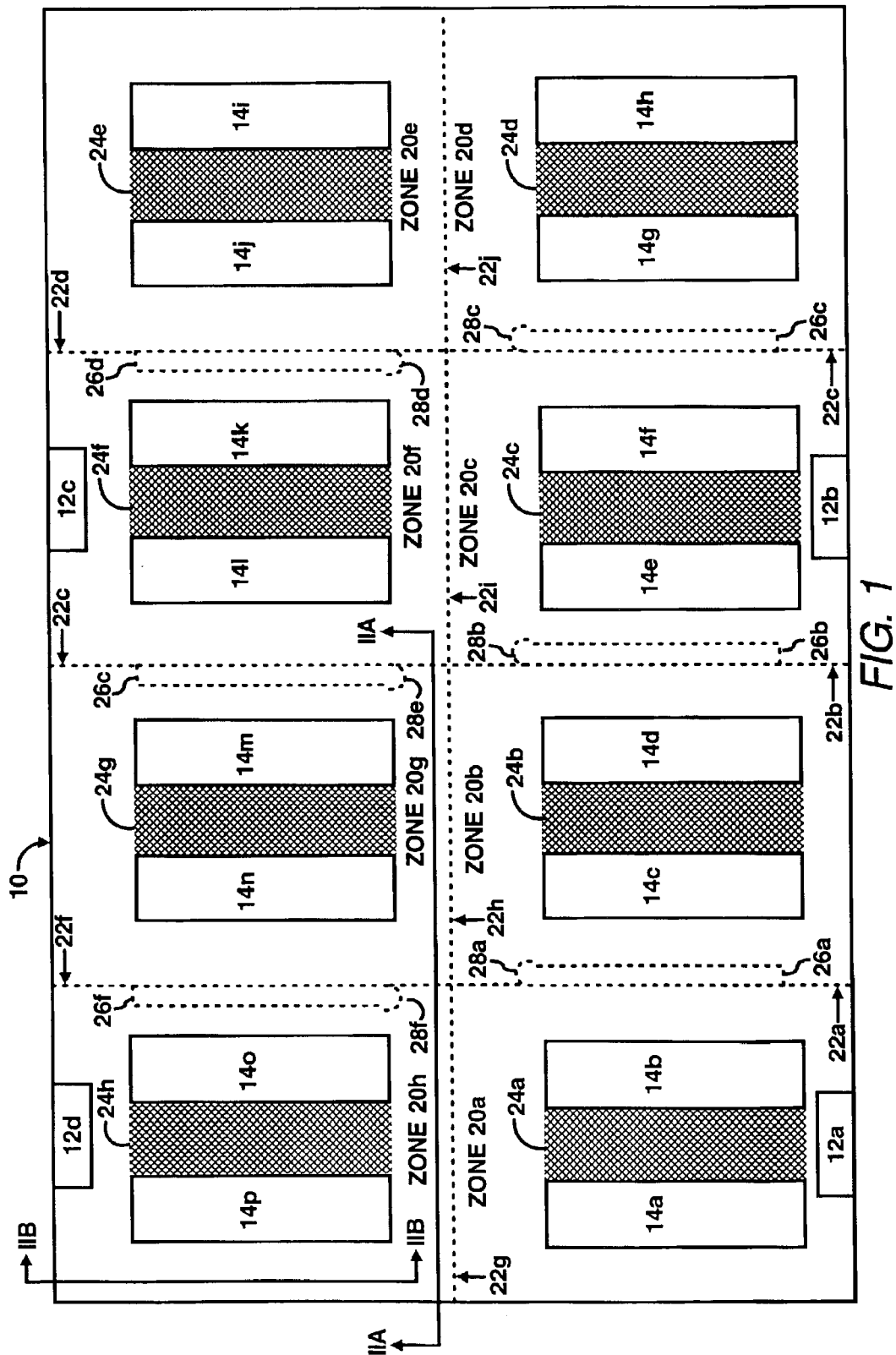
FIG. 1 shows a simplified schematic illustration of a data center containing a cooling system in accordance with an embodiment of the invention.

FIG. 1 shows a simplified schematic illustration of a floor plan for a data center 10 containing a plurality of cooling systems 12a–12d. The cooling systems 12a–12d are operable to maintain a plurality of racks 14a–14p within a predetermined temperature range. Although not explicitly shown in FIG. 1, the data center 10, according to this embodiment of the invention, includes a raised floor 16 (See FIG. 2A). A pressurized enclosure 18 (See FIG. 2A) is located beneath the raised floor 16. Although the data center 10 is illustrated in FIG. 1 as containing sixteen racks 14a–14p and four cooling systems 12a–12d, it should be understood that the data center may include any number of racks, e.g., 100 racks, and cooling systems, e.g., one or more. Therefore, sixteen racks are for illustrative and simplicity of description purposes only and are not intended to limit the invention in any respect.

The racks 14a–14p generally house a plurality of components (not shown), e.g., processors, micro-controllers, high speed video cards, memories, semi-conductor devices, and the like. The components may be elements of a plurality of subsystems (not shown), e.g., computers, servers, etc. The subsystems and the components may be implemented to perform various electronic, e.g., computing, switching, routing, displaying, and the like, functions. In the performance of these electronic functions, the components, and therefore the subsystems, generally dissipate relatively large amounts of heat. Because racks 14a–14p have been generally known to include upwards of forty (40) or more subsystems, they may require substantially large amounts of cooling fluid to maintain the subsystems and the components generally within a predetermined operating temperature range. According to an embodiment of the invention, by substantially controlling the amount of cooling fluid delivered to the components and the subsystems located in the racks 14a–14p based upon their respective heat loads, the power consumed by the cooling systems 12a–12d to supply the cooling fluid may also be controlled.

In order to control the amount of cooling fluid delivered to the components and the subsystems located in the racks 14a–14p based upon their respective heat loads, the pressurized enclosure 18 may be subdivided into a plurality of zones 20a–20h by a plurality of partitions 22a–22j (e.g., barriers, walls, etc.). In addition, according to an embodiment of the invention, the pressurized enclosure 18 may be configured to function as a plenum. In this regard, cooling fluid may enter the pressurized enclosure 18 below the cooling systems 12a–12d and exit the pressurized enclosure 18 through a plurality of vents 24a–24h. Furthermore, a plurality of controllable partitions ("CPs") 26a–26f may be configured to control cooling fluid movement between the zones 20a–20h. In various embodiments of the invention, the CPs 26a–26f may include louvered, rotating and/or retractable partitions. Each of the CPs 26a–26f may include a respective motor 28a–28f. However, it is to be understood that any suitable actuating device may be substituted for some or all of the motors 28a–28f. Examples of reasonable actuating devices include, but are not limited to, electromagnetic, pneumatic, and like devices.

In addition, although CPs are not shown in all of the partitions 22a–22j, it is within the scope of the invention that some or all of the partitions 22a–22j may include at least one controllable partition. Furthermore, although in the above description of the data center 10, the raised floor 16 is mentioned, it is within the scope of the invention that a lowered ceiling and/or the raised floor 16 may be included in the data center.

In the following description, the operation of a subset of the cooling systems 12a–12d are shown for simplicity and illustrative purposes. In particular, the operation of the cooling system 12d is discussed by way of example for the operation of cooling systems 12a–12d.

Figure 2B:
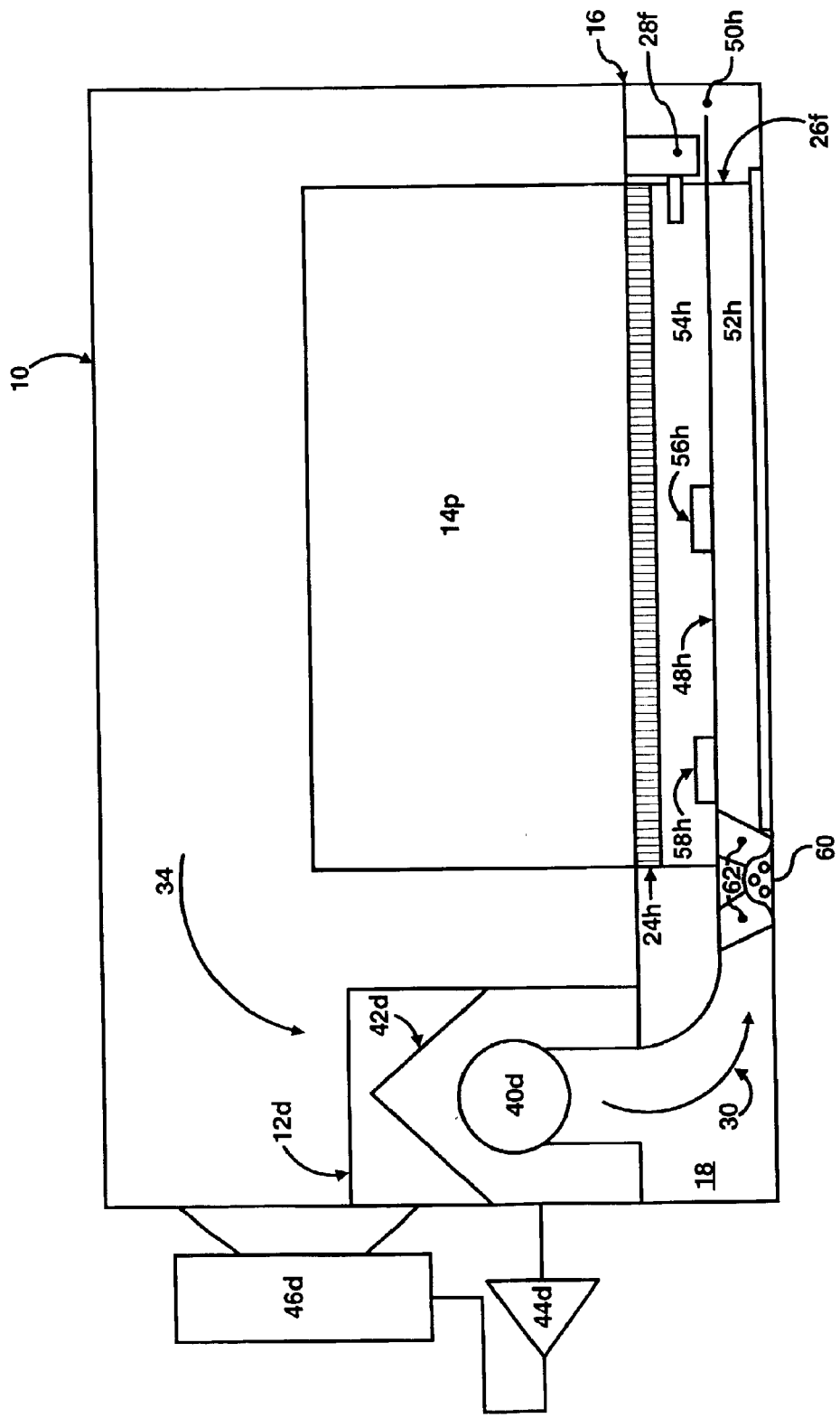
FIG. 2B shows a simplified schematic cross-sectional side view along lines IIB—IIB of FIG. 1 in accordance with an embodiment of the invention.

FIG. 2A shows a simplified schematic cross-sectional side view along lines IIA—IIA of FIG. 1 containing zones 20g and 20h in accordance with an embodiment of the invention. Although not shown in FIG. 2A (See FIG. 2B), the cooling system 12d may include a fan for supplying cooling fluid into the pressurized enclosure 18 (e.g., plenum). In this manner, as indicated by the arrow 30, the cooling system 12d may supply cooling fluid into the pressurized enclosure 18. Air is supplied into the cooling system 12d from the returned cooling fluid in the data center 10 as indicated by arrows 34. In operation, the returned cooling fluid enters into the cooling system 12d as indicated by arrows 34 and is cooled by operation of various well know components of a cooling system (e.g., cooling coil, compressor, condenser, chilled water heat exchange, etc.) and/or in any reasonably suitable manner generally known to those of ordinary skill in the art. In addition, based upon the cooling fluid needed by the heat loads in the racks 14m–14p, the cooling system 12d may be operated at various levels. For example, the capacity (e.g., the amount of work exerted on the refrigerant) of the compressor and the speed of the fan may both be modified to thereby control the temperature and the amount of cooling fluid flow delivered to the racks 14m–14p. In this respect, the compressor may be a variable capacity compressor and the fan may be a variable speed fan.

As the cooling fluid flows from the cooling system 12d and into the pressurized enclosure 18 as indicated by the arrow 30, the flow of cooling fluid may be controlled by the CP 26f. In one respect, the velocity and the volume flow rate of the cooling fluid may be regulated by varying the shape and/or opening size of the CP 26f. Thus, according to this embodiment of the invention, the zones 20h and 20g may receive substantially individualized and localized amounts of cooling fluid according to the heat loads of the respective racks 14m–14p within each zone 20h and 20g. For example, if the racks 14m and 14n in zone 20g are generating relatively little heat load as compared to racks 14o and 14p in zone 20h, the CP 26f may be controlled to reduce the velocity and/or volume flow rate of the cooling fluid being conveyed therethrough. In this manner, the volume flow rate of cooling fluid available to flow through the vents 24h and 24g may be modified.

The arrows 32 indicate the general direction of travel of the cooling fluid into the racks 14m–14p and the arrows 34 indicate the general direction of travel of fluid heated by the heat dissipating components located within the racks 14m–14p. As may be seen in FIG. 2A, the areas between the racks 14m–14p may comprise either cool aisles 36 or hot aisles 38, or a combination thereof. The cool aisles 36 are those aisles that include the vents 24g and 24h and thus receive cooling fluid for delivery to the racks 14m–14p. The hot aisles 38 are those aisles that receive air heated by the heat dissipating components in the racks 14m–14p.

In addition to controlling the flow of cooling fluid by controlling the CP 26f, it is within the scope of the invention that flow of cooling fluid may also be controlled by the manipulation of dynamically controllable vents. In this regard, the vents 24h and 24g may be dynamically controllable vents and may be operated to control the velocity and the volume flow rate of the cooling fluid therethrough. Furthermore, various sections of each of the racks 14m–14p may also receive substantially individualized amounts of cooling fluid. By way of example, if the bottom halves of the racks 14m and 14n are operating at maximum power, thereby dissipating a maximum level of heat load, and the upper halves are operating at little or no power, the vent 24g may be configured to enable cooling fluid flow therethrough to have a relatively high volume flow rate with a relatively low velocity. In this manner, the cooling fluid may operate to generally supply greater cooling to the lower halves of the racks 14m and 14n, whereas the upper halves may receive relatively lesser amounts of cooling fluid. In addition, if the upper halves of the racks 14o and 14p are operating at approximately 50 percent of their maximum power, and the lower halves are operating at little or no power, the vent 24h may be configured to enable cooling fluid flow therethrough to have a relatively low volume flow rate with a relatively high velocity. In this manner, the cooling fluid flow may have sufficient momentum to adequately reach and cool the upper halves of the racks 14o and 14p. In one respect, therefore, the amount of energy consumed by the cooling system 12d in maintaining the racks 14m–14p at a predetermined temperature range may be substantially reduced in comparison with conventional data center cooling systems.

A more detailed description of the above-described embodiment may be found in co-pending U.S. application Ser. No. 09/970,707, filed Oct. 5, 2001, which is assigned to the assignee of the present invention and is incorporated by reference herein in its entirety.

In the following description, the operation of a subset of the cooling systems 12a–12d is shown for simplicity and illustrative purposes.

FIG. 2B shows a simplified schematic cross-sectional side view along lines IIB—IIB of FIG. 1 containing zone 20h in accordance with an embodiment of the invention. The cooling system 12d generally includes a fan 40d for supplying cooling fluid (e.g., air) into the pressurized enclosure 18. Air, heated in the data center 10 is supplied to the fan 40d as indicated by an arrow 34. In operation, the returned cooling fluid (e.g., heated air, return air, etc.) enters into the cooling system 12 as indicated by the arrow 34 and is cooled by operation of a cooling coil 42d, a compressor 44d, and a condenser 46d, in any reasonably suitable manner generally known to those of ordinary skill in the art. As described hereinabove, in an embodiment of the invention, the compressor 44d may be a variable capacity compressor and/or the fan 40d may be a variable speed fan. Although a compressor 44d is illustrated, it is to be understood that any reasonably suitable cooling device may be implemented to cool the cooling fluid e.g., chilled water heat exchange and the like.

According to an embodiment of the invention, the cooling fluid supply for flow through the vent 24h may be maintained at a relatively uniform pressure. In this respect, the pressurized enclosure 18 may include a divider 48h. The length of the divider 48h may extend substantially along the entire length of pressurized enclosure 18, i.e., in the direction generally perpendicular to the plane of FIG. 2B. The width of the divider 48h may be configured to extend from the cooling system 12d to substantially the end of the pressurized enclosure 18 to thus create a gap 50h between a side edge of the divider 48h and a side surface of the pressurized enclosure 18. The divider 48h generally divides the pressurized enclosure 18 into two relatively separate chambers 52h, 54h. The first chamber 52h is in fluid communication with the outlet of the fan 40d. The second chamber 54h is in fluid communication with the first chamber 54h substantially through the gap 50h. In this respect, the cooling fluid flow originating from the fan 40d must travel substantially the entire width of the pressurized enclosure 18, i.e., through the first chamber 52h, for the fluid flow to enter into the second chamber 54h.

The cooling fluid in the second chamber 54h may be maintained at a substantially uniform static pressure by virtue of the manner in which the cooling fluid is introduced into the second chamber 54h. The rate at which the cooling fluid is supplied into the first chamber 52h by the fan 40d may cause a relatively large amount of turbulence in the cooling fluid located in the first chamber 52h. The turbulence is generally greatest at the outlet of the fan 40d and generally decreases as the distance from the outlet increases. By virtue of the distance the cooling fluid must travel to enter into the second chamber 54h, the cooling fluid may have substantially stabilized, thus enabling the cooling fluid entering into the second chamber 54h to be relatively calm. In this respect, the divider 48h operates to provide a relatively consistent cooling fluid pressure supply for the vent 24h.

The pressure of the cooling fluid located in the second chamber 54h may be measured by a pressure sensor 56h. In this respect, the pressure sensor 56h may detect any discernable changes in the pressure of the cooling fluid located within the second chamber 54h and relay that information to a cooling system controller (not shown). Similarly, pressure sensors 56a–56g (not shown) may detect any discernable changes in the pressure of the cooling fluid located within the respective chambers 54a–54g and relay that information to the cooling system controller. The cooling system controller may operate to alter the output of the fan 40d in response to the detected changes in pressure. Therefore, operation of the fan 40d may be related to the cooling requirements of the racks 14a (See FIG. 2A) and 14p within the zone 20h and thus, the amount of energy required to supply the zone 20h with cooling fluid may be substantially optimized. In one respect, only that amount of energy required to substantially cool the components contained in the zone 20h may be expended, which may correlate to a substantial energy savings over known cooling systems.

More generally, by controlling the operation of the CPs 26a–26f (See FIG. 1), operation of the cooling systems 12a–12d may be related to the cooling requirements of each of the zones 20a–20h and the amount of energy required to supply the racks 14a–14p with cooling fluid may be substantially optimized. For example, if racks 14i, 14j, 14o, and 14p are substantially idle, the CPs 26d and 26f may be controlled to substantially stop the flow of cooling fluid, while the CP 26e is controlled to allow the flow of cooling fluid. In this manner, cooling system 12d may be essentially shut off while cooling system 12c is utilized to cool zones 20f and 20g. Thus, in another respect, only that amount of energy required to substantially cool the components contained within each zone 20a–20h may be expended, which may correlate to a substantial energy savings over known cooling systems.

The capacity of the compressor 44d may vary according to changes in the temperature of the cooling fluid located in the second chamber 54h. As such, a plenum temperature sensor 58h may be located within the second chamber 54h to relay temperature measurements to the cooling system 12d. The plenum temperature sensor 58h may comprise any reasonably suitable temperature sensor known to those skilled in the art. Therefore, the compressor 44d may be operated to generally maintain the temperature of the cooling fluid within the second chamber 54h at a substantially constant level. In addition, the capacity of the compressor 44d may also vary according to detected and/or anticipated changes in heat loads generated in the racks 14o and 14p. As an example, the compressor 44d capacity may be increased as the heat loads generated in the racks 14o and 14p increase. Furthermore, as the second chambers 54a–54g (not shown) may also include respective plenum temperature sensors 58a–58g (not shown), the capacity of the compressors 44a–44d (compressors 44a–44c not shown) may also vary according to detected and/or anticipated changes in heat loads generated in the racks 14a and 14p. In this regard, the power required to operate the compressors 44a–44d may be substantially optimized, thereby reducing the total power required to operate the cooling systems 12a–12d.

The compressors 44a–44d may thus be controlled to either increase or decrease the mass flow rate of a refrigerant therethrough. Because the specific type of compressors 44a–44d and fans 40a–40d to be employed with the embodiments of the invention may vary according to individual needs, the invention is not limited to any specific type of compressor or fan. Instead, any reasonably suitable types of compressors 44a–44d and fans 40a–40d that are capable of accomplishing certain aspects of the invention may be employed with the embodiments of the invention. The choice of compressors 44a–44d and fans 40a–40d may depend upon a plurality of factors, e.g., cooling requirements, costs, operating expenses, etc.

Although the description above pertains to cooling systems that employ compressors, it should be understood that embodiments of the invention may implement cooling systems having other types of cooling devices, e.g., water chilled heat exchangers and the like.

Various obstructions 60 such as wires and communication lines may be located in the pressurized enclosure 18 beneath the raised floor 16. These obstructions may increase turbulence. In order to minimize this turbulence, one or more baffles 62 may be placed over the obstruction 60. The baffle 62 is generally operable to generate an essentially laminar (e.g., smooth, non-turbulent, etc.) flow of cooling fluid. For example, the baffle 62 may be constructed from a plurality of tubes (not shown) aligned in the direction of fluid flow. These tubes may be configured in a honeycomb or other such pattern. Furthermore, it is within the scope of the invention that the baffle 62 or similar structure be configured to rotate about an axis and controlled by an actuator (not shown). In this manner, the direction of cooling fluid flowing within the pressurized enclosure 18 may be modulated. For example, the baffle 62 may be controlled to direct cooling fluid toward a subset (e.g., left, right, center, etc.) of the pressurized enclosure 18 in response to increased cooling needs in the corresponding subset of the zone 20a–20h. In another example, the baffle 62 may be controlled to direct the flow of cooling fluid upwards (e.g., out of a vent 24a–24h) or downwards (e.g., to increase the flow towards a partition 26a–26f).

Figure 3A:
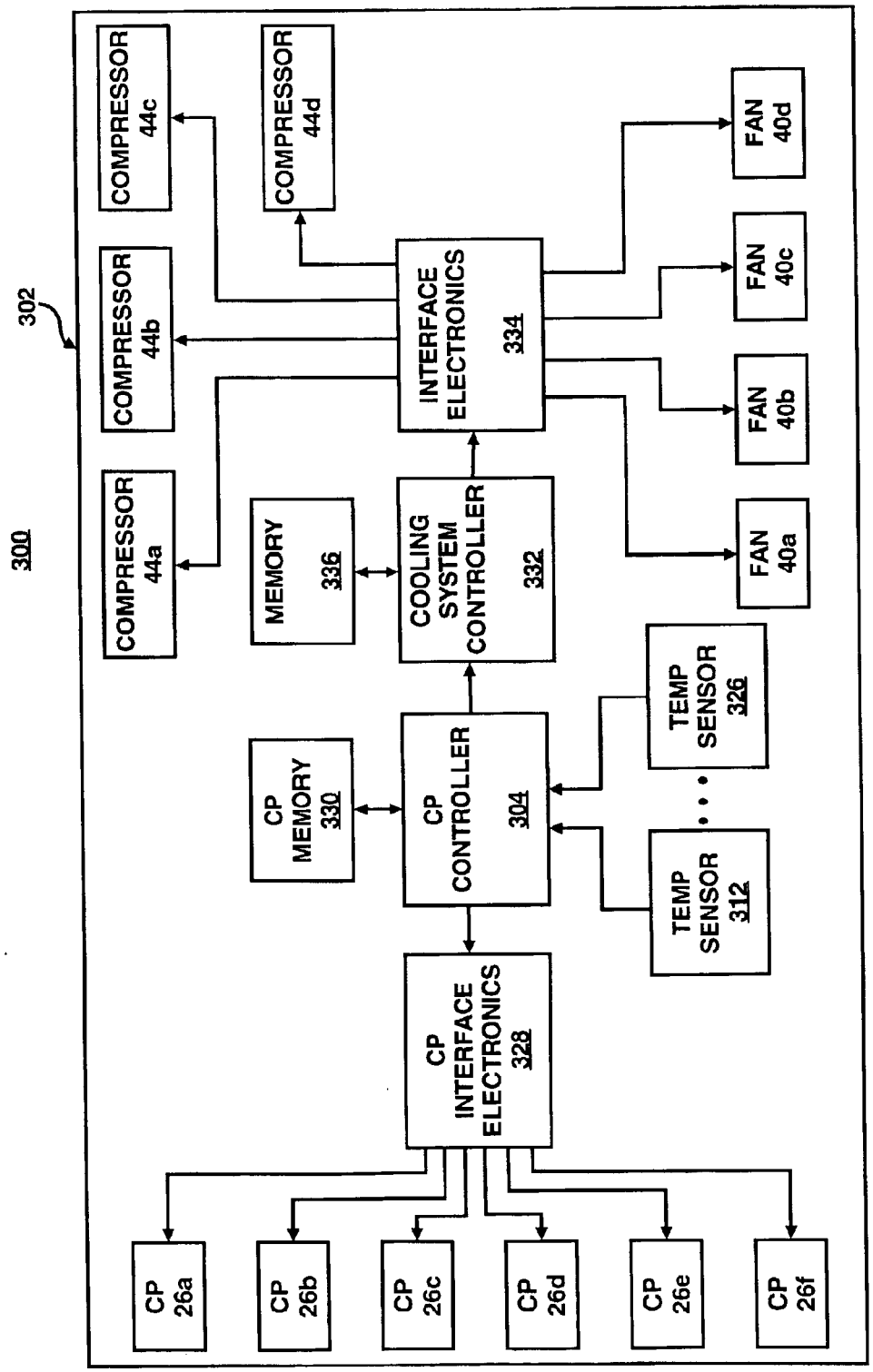
FIGS. 3A and 3B each illustrate a block diagram of a control scheme for a cooling system according to various embodiments of the invention.

Referring to FIG. 3A, there is illustrated a block diagram 300 of a control scheme for a cooling system 302 according to an embodiment of the invention. The following description of the block diagram 300 is one manner in which the cooling system 302 may be operated. In this respect, it is to be understood that the following description of the block diagram 300 is but one manner of a variety of different manners in which such a cooling system 302 may be operated.

A CP controller 304 is generally configured to control the operation of the CPs 26a–26f. In this regard, the CP controller 304 may comprise a microprocessor, a microcontroller, an application specific integrated circuit (ASIC), and the like. The manner in which the CP controller 304 operates the CPs 26a–26f, i.e., the flow of cooling fluid therethrough, may be predicated upon the detected or anticipated temperatures of the racks 14a–14p (See FIG. 1) or portions thereof. For example, with regard to detected temperatures, a plurality of temperature sensors 312–326, e.g., thermocouples, may be positioned at various positions around the subsystems and/or the racks 14a–14p. One or more of the temperature sensors 312–326 may correspond to a respective zone 20a–20h within the data center 10. By way of example, the temperature detection by one temperature sensor 312 may result in a corresponding modulation of one CP 26a and/or the temperature detection by one temperature sensor 312 may result in the modulation of a plurality of CPs 26a–26c. Alternatively, with regard to anticipated temperatures, anticipated cooling requirements for each of the racks 14a–14p and/or various sections of the racks may be predicated upon an impending load on the racks 14a–14p and/or sections of the racks. For example, the CP controller 304 may be connected to another controller, e.g., a central controller for the subsystems, which anticipates the heat load the components and/or the subsystems will dissipate. This information may be relayed to the CP controller 304 which may then manipulate the CPs 26a–26f according to the anticipated load.

Although FIG. 3A illustrates eight temperature sensors 312–326, it should be understood that the number of temperature sensors is not critical to the operation of the embodiment of the invention. Instead, the cooling system 302 may include any reasonably suitable number of temperature sensors to thus measure the temperatures of any reasonably suitable number of racks 14a–14p or portions thereof. The number of temperature sensors and the temperature measurements of the number of racks may be upgradable, e.g., scalable, to include any additional components and/or racks that may be included in the data center 10. In addition, the temperature sensors need not be stationary. In this regard, according to another embodiment of the invention, a mobile device (not shown) is implemented to gather or measure at least one local environmental condition (e.g., temperature, air flow, humidity, etc.) in the data center 10. More particularly, the mobile device is configured to travel around the racks to determine the one or more environmental conditions at various locations throughout the data center. In addition, the device may be configured to detect the one or more environmental conditions at various heights throughout the data center.

A more detailed description of the above-described embodiment may be found in co-pending U.S. application Ser. No. 10/157,892, filed May 31, 2002, which is assigned to the assignee of the present invention and is incorporated by reference herein in its entirety.

If there is an actual detected change or an anticipated change in the temperature of the respective racks 14a–14p and/or portions thereof, the CP controller 304 generally operates to manipulate the corresponding one or more CP 26a–26f to compensate, i.e., changes the volume flow rate, velocity, and other similar characteristics of the cooling fluid, for the change in temperature. In this respect, each of the zones 20a–20h and/or portions thereof generally receives substantially only the amount of cooling fluid necessary to maintain the temperature of the portions of the respective racks therein to within a predetermined temperature range. As will be seen from the discussion hereinbelow, by controlling the cooling fluid flow in this manner, the compressors 44a–44d and fans 40a–40d may be operated at substantially optimized levels, thereby decreasing the amount of energy and thus the operating costs required to operate these devices.

CP interface electronics 328 may be provided to act as an interface between the CP controller 304 and the components, e.g., control the opening in the CPs 26a–26f and the direction of cooling fluid flow through the CPs 26a–26f, etc, for operating the CPs 26a–26f.

The CP controller 304 may also be interfaced with a CP memory 330 configured to provide storage of a computer software that provides the functionality of the cooling system and may be executed by the CP controller 304. The memory 320 may also be configured to provide a storage for containing data/information pertaining to the manner in which each of the CPs 26a–26f may be manipulated in response to the detected and/or anticipated temperatures of the portions of the racks 14a–14p. In keeping with the example cited hereinabove, the CP controller 304 may operate the CP 26a to increase the volume flow rate and decrease the velocity of the cooling fluid flowing therethrough in response to a detected increase in the heat load of a lower portion of a corresponding rack. The memory 320 may be implemented as a combination of volatile and non-volatile memory, such as dynamic random access memory (DRAM), EEPROM, flash memory, and the like.

The CP controller 304 may be configured to relay data/information pertaining to the flow of cooling fluid through the CPs 26a–26f to a cooling system controller 332. The cooling system controller 332 is generally configured to control the operation of the cooling system 302. In this regard, the cooling system controller 332 may comprise a microprocessor, a micro-controller, ASIC, and the like.

Interface electronics 334 may be provided to act as an interface between the cooling system controller 332 and the components for operating the compressors 44a–44d and the fans 40a–40d, e.g., the supply of voltage to vary the respective speeds of the compressors and the fans, direct control of each compressor and the fan, etc.

The cooling system controller 332 may also be interfaced with a memory 336 configured to provide storage of a computer software that provides the functionality of the cooling system 302, and may be executed by the cooling system controller 332. The memory 336 may also be configured to provide a storage for containing data/information pertaining to the manner in which the compressors 44a–44d and the fans 40a–40d may be manipulated in response to variations in the cooling fluid flow through the CPs 26a–26f. In keeping with the example cited hereinabove, the cooling system controller 332 may operate the compressor 44a and the fan 40a to increase/decrease the volume flow rate of the cooling fluid flow in response to various degrees of detected increases/decreases in the volume flow rate through the CP 26a, or using correlations thereof. More particularly, a look up table (not shown) may be stored in the memory 336. By way of example, the look up table may include information pertaining to the level of compressor 44a speed and fan 40a output increase necessary for a detected increase in the volume flow rate. In this respect, the compressor 44a speed and the fan 40a output may be varied substantially incrementally in response to detected changes in the volume flow rate. The memory 336 may be implemented as a combination of volatile and non-volatile memory, such as dynamic random access memory (DRAM), EEPROM, flash memory, and the like.

Although FIG. 3A illustrates a single CP controller 304 configured to operate the CPs 26a–26f, it should be understood that a plurality of CP controllers may be implemented to perform the functions of the CP controller 304 without deviating from the scope and spirit of the invention.

Figure 3B:
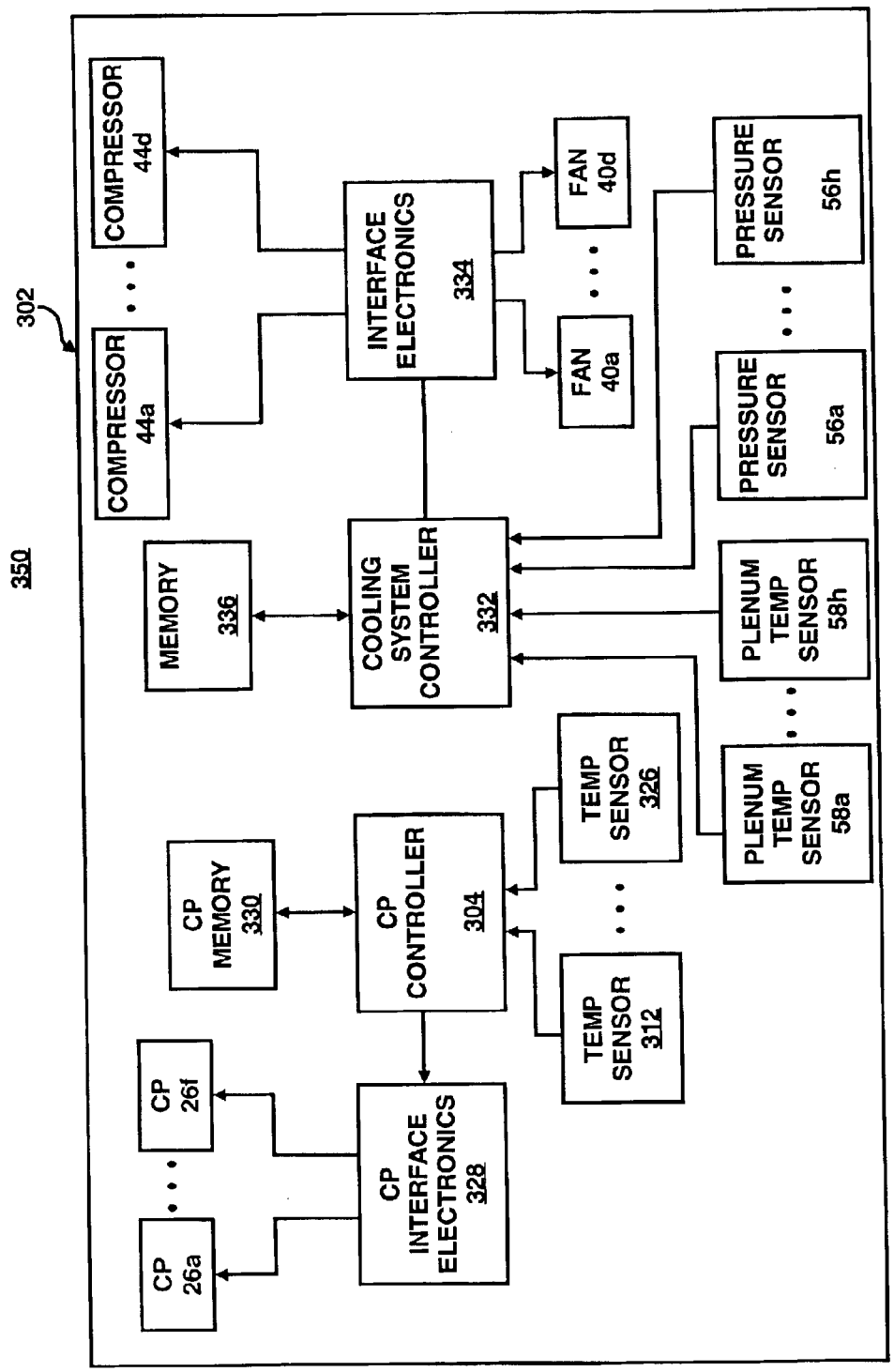

In FIG. 3B, there is illustrated a block diagram 350 of a control scheme for a cooling system 302 according to another embodiment of the invention. The elements illustrated in the block diagram 350 operate in substantially the same manner as those elements illustrated in the block diagram 300. However, one difference lies in the substantially independent operability of the cooling system controller 332. That is, operation of the cooling system controller 332 may not be directly related to the operation of the CP controller 304. Because of the apparent similarities between the block diagrams 300 and 350, only those elements that differ between the block diagrams will be described hereinbelow.

The pressure sensors 56a–56h are configured to measure the pressure within the second chambers 54a–54h of the pressurized enclosure 18 as described hereinabove. The pressure measurements and/or any discernable changes in the pressure measurements obtained by the pressure sensors 56a–56h may be relayed to the cooling system controller 332. In addition, the plenum temperature sensors 58a–58h may be configured to measure the temperature of the fluid within the second chambers 54a–54h. The temperature measurements and/or any discernable changes in the temperature obtained by the plenum temperature sensors 58a–58h may also be relayed to the cooling system controller 332.

The cooling system controller 332 may manipulate the capacity of the compressors 44a–44d based upon the measured temperature of the fluid. That is, the temperature of the fluid within the second chambers 54a–54h may be maintained at a substantially constant level by manipulation of the compressors. Further, the output of the fans 40a–40h may be manipulated based upon the measured pressure of the fluid in the second chambers 54a–54h to vary the amount of cooling fluid supplied and to thereby substantially maintain the pressure of the cooling fluid within the second chambers 54a–54h at a substantially uniform level. Thus, the cooling system controller 332 is operable to individually increase the speed of the compressors 44a–44d and the fans 40a–40h output, e.g., expend a greater amount of energy, substantially as the heat loads in the racks 14a–14p requires such an increase.

For example, the cooling system controller 332 may increase the compressor 44d speed and fan 40d output by a relatively large amount in response to a relatively large decrease in the measured pressure by the pressure sensor 56g (although not explicitly shown, sensor 56g is indicated by the ellipsis between 56a and 56h) if the CP 26f is open. However, if the CP 26f is closed and the CP 26e is open, the cooling system controller 332 may increase the compressor 44c speed and fan 40c output by a relatively large amount in response to a relatively large decrease in the measured pressure by the pressure sensor 56g.

In a further example, in a situation where the cooling fluid demands of zone 20g exceed the cooling capacity of a subset of the cooling system 302 (e.g., one or a few of the compressors 44a–44d and the fans 40a–40d), the cooling system controller 332 may be configured to increase the output of a relatively larger subset of the cooling system 302 and control appropriate CPs 26a–26f to increase the flow of cooling fluid to the zone 20g. In this respect, the pressure within the second chamber 54g (although not explicitly shown, chamber 54g is indicated by the ellipsis between 54a and 54h) may be maintained at a substantially uniform level even when the pressures change by a relatively sharp amount. Consequently, the compressors 44a–44d and the fans 40a–40d are not operated at a substantially constant energy level and the amount of energy necessary is substantially lower than that of conventional cooling systems that typically operate at maximum energy levels.

The memory 336 may also be configured to store data/information pertaining to the control of the individual compressors' 44a–44d speeds and the outputs of the fans, 40a–40d corresponding to the measured pressure with the respective second chambers 54a–54h.

Figure 4A:
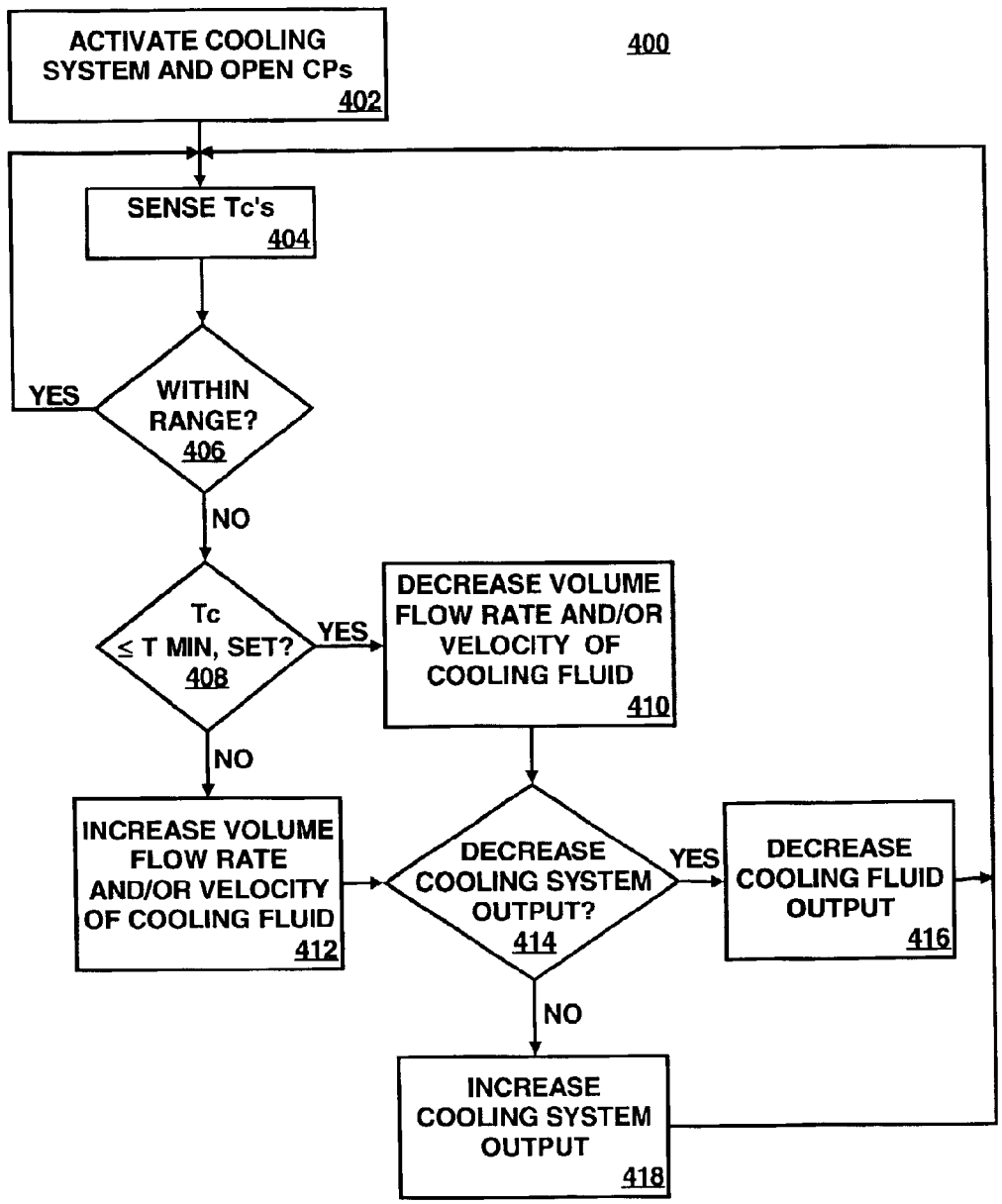
FIGS. 4A and 4B each show a flow diagram of a manner in which embodiments of the invention may be practiced.

FIG. 4A shows a flow diagram 400 of a manner in which an embodiment of the invention may be practiced. The following description of the flow diagram 400 is made with reference to the block diagram 300 illustrated in FIG. 3A, and thus makes reference to the elements cited therein. It is to be understood that the steps illustrated in the flow diagram 400 may be contained as a utility, program, subprogram, in any desired computer accessible medium. In addition, the flow diagram 400 may be embodied by a computer program, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Examples of computer readable storage devices include conventional computer system RAM (random access memory), ROM (read only memory), EPROM (erasable, programmable ROM), EEPROM (electrically erasable, programmable ROM), and magnetic or optical disks or tapes. Examples of computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that those functions enumerated below may be performed by any electronic device capable of executing the above-described functions.

In the flow diagram 400, the cooling system 302 is activated and the CPs 26a–26f are opened at step 402. The temperature of a component (Tc) generally corresponds to the heat load of the heat dissipating components and therefore the subsystems contained in the racks 14a–14p. Therefore, the Tc's may be based upon the temperatures of specific heat dissipating components and subsystems. In addition, the Tc's may be based upon the temperatures in the general vicinity of the racks and/or sections of the racks. Thus, those skilled in the art will understand that certain embodiments of the invention may be employed with the temperature sensors 312–326 located at various positions throughout the data center 10. The number of temperature sensors and the temperature measurements of the number of racks may be upgradable, e.g., scalable, to include any additional components and/or racks that may be included in the data center. In addition, the temperature sensors need not be stationary. In this regard, according to another embodiment of the invention, a mobile device (not shown) is implemented to gather or measure at least one local environmental condition (e.g., temperature, air flow, humidity, etc.) in the data center 10. More particularly, the mobile device is configured to travel around the racks to determine the one or more environmental conditions at various locations throughout the data center. In addition, the device may be configured to detect the one or more environmental conditions at various heights throughout the data center. The information gathered by the mobile device may be transmitted to the cooling system controller 332. As described hereinabove, the cooling system controller 332 may vary the delivery and temperature of cooling fluid according to the one or more detected environmental conditions. In this respect, the energy necessary to cool the racks and the components contained therein, may substantially be optimized.

A more detailed description of the above-described embodiment may be found in co-pending U.S. application Ser. No. 10/157,892, filed May 31, 2002, which is assigned to the assignee of the present invention and is incorporated by reference herein in its entirety.

Moreover, use of the term "rack" herein generally refers additionally to sections of the racks and thus may not necessarily refer to an entire rack. Thus, the use of the term "rack" throughout the disclosure is not meant to limit certain aspects to entire racks, but instead, is implemented to simplify the description of certain embodiments of the invention.

At step 404, the temperatures of the components (Tc's) are individually sensed by the temperature sensors 312–326. Alternatively, the Tc's may be anticipated in the manner described hereinabove with respect to FIG. 3A. At step 406, it is determined whether each of the measured temperatures are individually within a predetermined range of operating temperatures, e.g., between a maximum set point temperature (Tmax,set) and a minimum set point temperature (Tmin,set). The predetermined range of operating temperatures may be set according to a plurality of factors. These factors may include, for example, the operating temperatures set forth by the manufacturers of the subsystems and components located in the racks, through testing to determine the optimal operating temperatures, etc. In addition, the predetermined range of operating temperatures may vary from one subsystem to another on the basis that various subsystems generally may operate effectively at various temperatures.

The measured and/or anticipated temperatures for those racks determined to have heat loads that fall within the predetermined range of operating temperatures are sensed again at step 404. For those racks determined to have heat loads that do not fall within the predetermined temperature range, i.e., fall outside of Tmin,set and Tmax,set, it is determined whether the sensed temperature equals or falls below the Tmin,set at step 408. In general, the range of temperatures Tmin,set and Tmax,set pertain to threshold temperatures to determine whether to increase or decrease the flow of cooling fluid delivered to the racks. The predetermined temperature range may be based upon a plurality of factors, for example, a threshold operating range of temperatures that may be determined through testing to substantially optimize the performance of the subsystems contained in the racks. Moreover, the predetermined temperature range may vary for each rack because various components generally may operate effectively at various temperatures and thus various threshold temperatures may be optimal.

If the Tc's of some of the racks are below or equal to the Tmin,set, the CP controller 304 may operate to decrease the volume flow rate and/or the velocity of cooling fluid to those racks at step 410. The determination of whether to decrease either or both the volume flow rate and the velocity of the cooling fluid may be based upon the detected temperatures of the racks. For example, if the subsystems on a bottom half of a rack are operating at 50 percent of maximum capacity, and the subsystems on an upper half of the rack are operating at or near zero capacity, the velocity of the cooling fluid may be reduced whereas the volume flow rate may remain substantially constant. This may occur, for example, because the cooling fluid need not travel a relatively long distance but may still need to supply the bottom half with a sufficient amount of cooling fluid.

If the Tc's of some of the racks exceed the Tmin,set (i.e., also exceed the Tmax,set), the CP controller 304 may operate to increase the volume flow rate and/or the velocity of cooling fluid to those racks at step 412. The determination of whether to increase either or both the volume flow rate and the velocity of the cooling fluid may be based upon the detected temperature of the racks. For example, if the subsystems on the top half of a rack are operating at 100 percent capacity, and the subsystems on a bottom half of the rack are operating at or near zero capacity, the velocity and the volume flow rate of the cooling fluid may both be increased. This may occur, for example, because the cooling fluid must travel a relatively long distance and supply the top half with a sufficient amount of cooling fluid.

According to an embodiment of the invention, the decrease in volume flow rate and/or velocity of the cooling fluid flow at step 410 and the increase in volume and/or velocity of the cooling fluid at step 412 may be accomplished by incrementally varying the cooling fluid flow through the appropriate CPs. An example will be made for the instance where a CP allows a certain amount of cooling fluid to flow therethrough, and the CP is manipulated to decrease the volume flow rate of the cooling fluid, and where the decrease in fluid flow is insufficient to cause the Tc for the racks within that respective zone to fall within the predetermined range. In this instance, during a subsequent run through steps 304–310, the CP may be controlled to further decrease the volume flow rate of the cooling fluid therethrough by an incremental amount. By repeating this process a number of times, the temperature of the racks within that respective zone may be substantially brought within the predetermined range.

At step 414, the cooling system controller 332 may determine whether to decrease the cooling fluid output, e.g., decrease each compressor 44a–44d speed and each fan 40a–40d output. The determination of whether to decrease the cooling fluid output may be made in response to the manipulations made to the CPs 26a–26f by the CP controller 304. For instance, if the total amount of decreases in the volume flow rates of the cooling fluid exceeds the total amount of increases in the volume flow rates flow of the cooling fluid, the cooling system controller 332 may operate to decrease the cooling fluid output at step 416. Alternatively, if the total amount of increases in the volume flow rates of the cooling fluid exceeds the total amount of decreases, the cooling system controller 332 may operate to increase the cooling system 302 output at step 418.

Following steps 416 or 418, or if the increases in the volume flow rates of the cooling fluid through the CPs 26a–26f equals the decreases, for example, the Tc's are sensed again at step 404. In addition, the steps following step 404 may be repeated for an indefinite period of time so long as the cooling system 302 is in operation.

It should be appreciated that the Tc's of some of the racks may fall below the Tmin,set, whereas the Tc's of other racks may exceed the Tmax,set. Thus, it should be appreciated that steps 410 and 412 may be respectively and substantially simultaneously performed on the various racks. In such an instance where the Tc of one rack in a zone exceeds the Tmax,set while the Tc of another rack in the same zone falls below the Tmin,set, the cooling requirements of relatively warmer rack may be utilized to control the flow of cooling fluid. However, it is within the scope of the invention that dynamically controllable vents be utilized to control the flow of cooling fluid to one rack or a subset thereof and thereby reduce the overall cooling requirements of a zone. A more detailed description of the above-described embodiment may be found in co-pending U.S. application Ser. No. 09/970,707, filed Oct. 5, 2001, which is assigned to the assignee of the present invention and is incorporated by reference herein in its entirety.

Figure 4B:
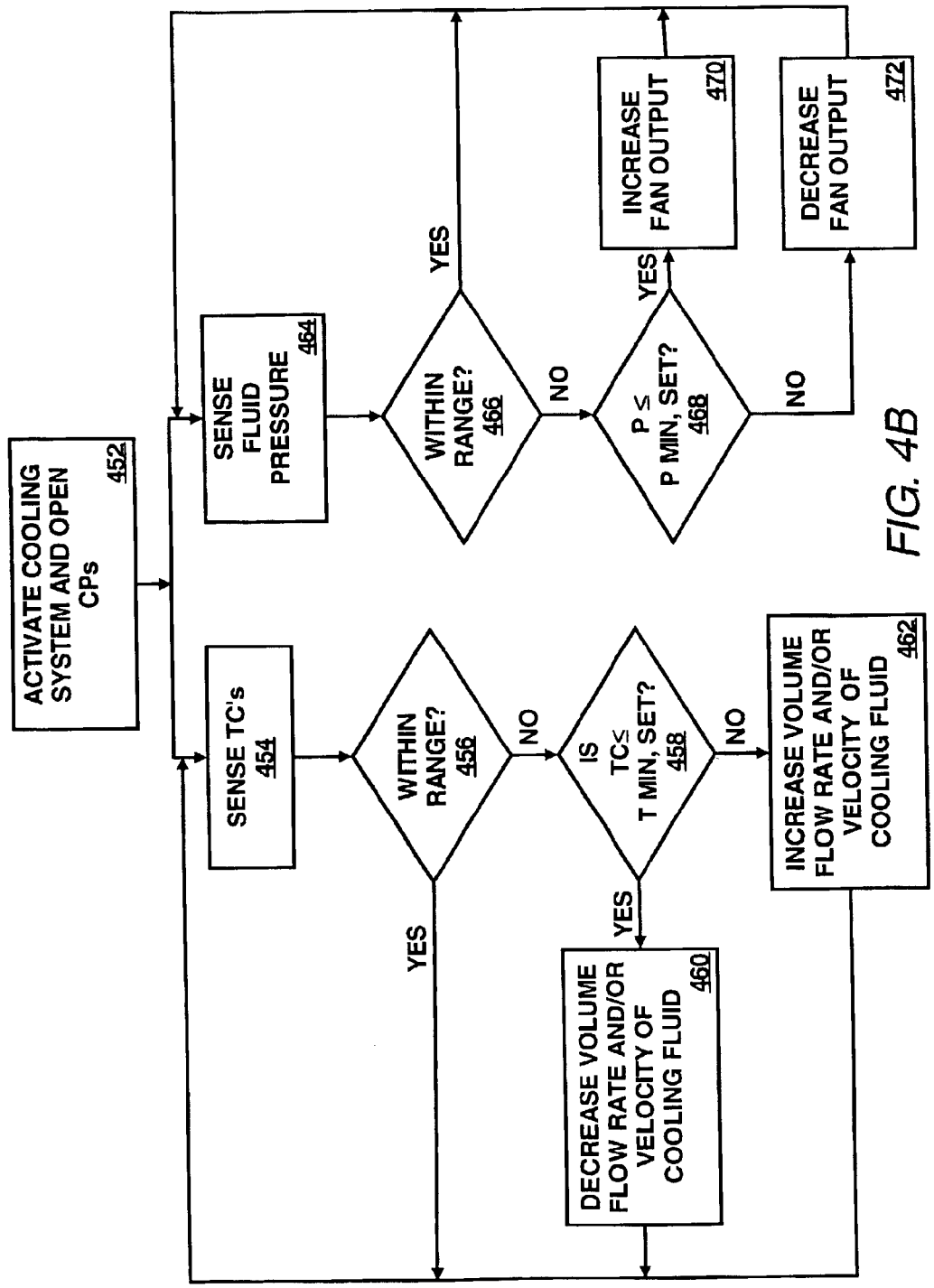

FIG. 4B shows a flow diagram 450 of a manner in which another embodiment of the invention may be practiced. The following description of the flow diagram 450 is made with reference to the block diagram 350 illustrated in FIG. 3B, and thus makes reference to the elements cited therein. It is to be understood that the steps illustrated in the flow diagram 450 may be contained as a utility, program, subprogram, in any desired computer accessible medium. In addition, the flow diagram 450 may be embodied by a computer program, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Examples of computer readable storage devices include conventional computer system RAM (random access memory), ROM (read only memory), EPROM (erasable, programmable ROM), EEPROM (electrically erasable, programmable ROM), and magnetic or optical disks or tapes. Examples of computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that those functions enumerated below may be performed by any electronic device capable of executing the above-described functions.

In the flow diagram 450, steps 452–462 respectively correspond to steps 402–412 recited hereinabove with respect to the flow diagram 400 illustrated in FIG. 4A. Therefore, a detailed description of steps 452–462 will not be made herein. Instead, one of ordinary skill in the art will readily recognize that the description made hereinabove with respect to steps 402–412 has general applicability to steps 452–462 and may thus be used interchangeably.

Therefore, beginning at step 464, the pressure of the cooling fluid supplying the zones 20a–20h may be measured by the respective pressure sensors 56a–56h. The measured pressure may be relayed to the cooling system controller 332. The cooling system controller 332 may determine whether the measured pressure is within a predetermined pressure range, e.g., a predetermined minimum set point pressure (Pmin,set) and a predetermined maximum set point pressure (Pmax,set), at step 466. The predetermined pressure range may be set according to a maximum desired volume flow rate and/or velocity of the cooling fluid to flow through the CPs 26a–26f. In addition, the predetermined pressure range may be the substantial optimum operating pressure desired for controlling the flow of cooling fluid through each of the zones 20a–20h. If the measured pressure is within the predetermined pressure range, the cooling system controller 332 returns to step 464.

If the measured pressure is not within the predetermined pressure range, it is determined whether the measured pressure (P) is below or equal to a minimum pressure set point (Pmin,set) at step 468. The pressure P is defined as the pressure difference between a location within the pressurized enclosure 18 and generally below a vent 24a–24h and a location essentially above the respective vent 24a–24h. In general, the predetermined pressure range pertains to the threshold pressures to determine whether to individually increase or decrease the supply of fluid, e.g., in each second chamber 54a–54h. The predetermined pressure range may be based upon a plurality of factors, for example, a threshold operating pressure or range of pressures that may be determined through testing to substantially optimize the performance of the cooling fluid output through the CPs 26a–26f.

If the P is determined to be below or equal to the Pmin,set, the cooling system controller 332 may operate to increase the cooling fluid output, e.g., by increasing the appropriate fan output, at step 470. Otherwise, if the P is determined to exceed the Pmin,set, and thereby exceed the Pmax,set, the cooling system controller 332 may operate to decrease cooling fluid output, e.g., by decreasing the appropriate fan output, at step 472.

Following steps 470 or 472, the cooling system controller 332 returns to step 464. In addition, the steps following step 464 may be repeated for an indefinite period of time so long as the cooling system 302 is in operation.

It should be appreciated that the Tc's of some of the zones and/or racks within some zones may fall below the Tmin,set, whereas the Tc's of other zones and/or racks within those zones may exceed the Tmax,set. Thus, in various embodiments of the invention, steps 460 and 462 may be respectively and substantially simultaneously performed on each the various zones and/or racks.

Figure 5:
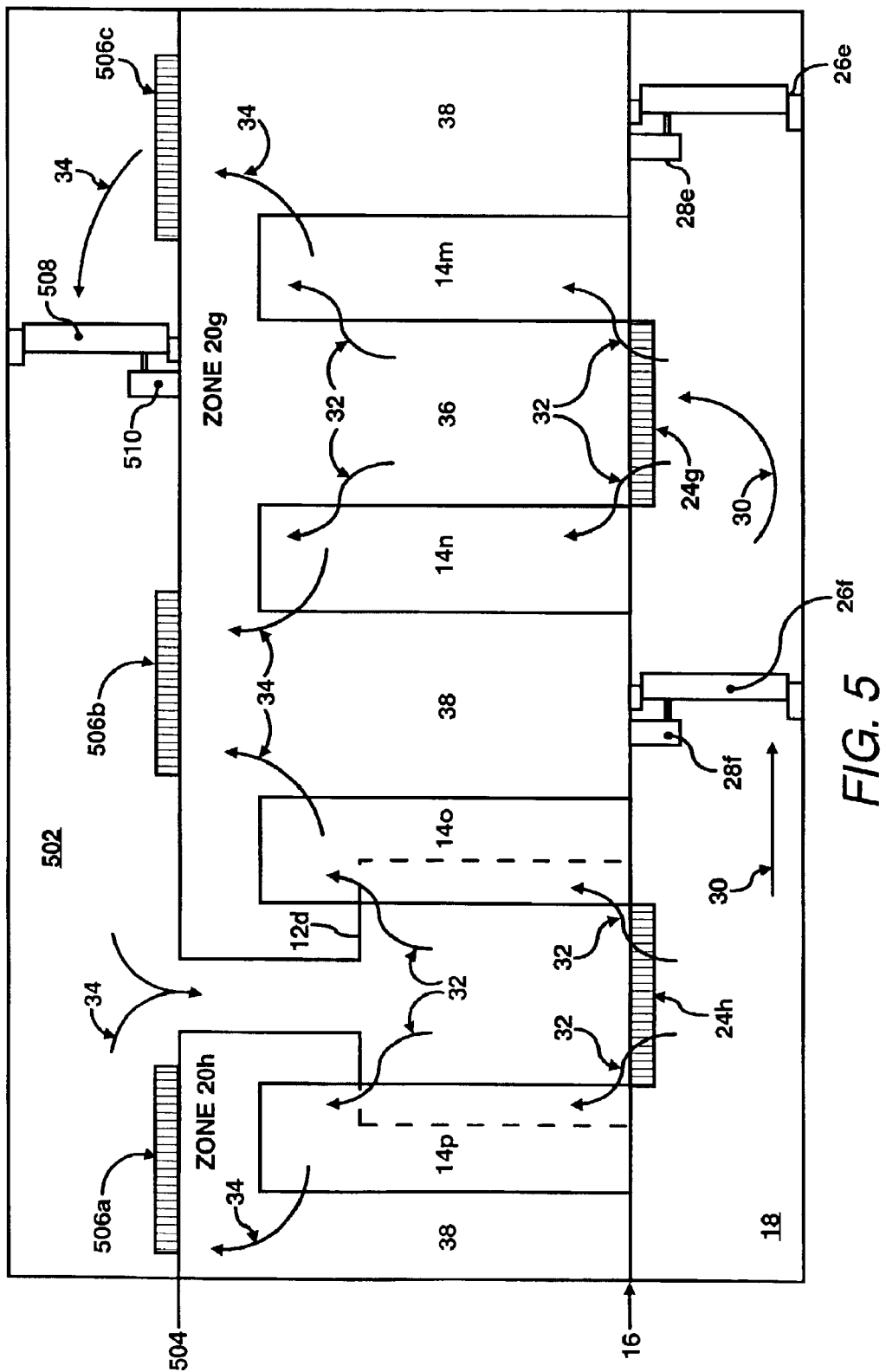
FIG. 5 shows a simplified schematic cross-sectional side view along lines IIA—IIA of FIG. 1 in accordance with another embodiment of the invention.

FIG. 5 shows a simplified schematic cross-sectional side view along lines IIA—IIA of FIG. 1 containing zones 20g and 20h in accordance with another embodiment of the invention. As shown in FIG. 5, the data center 10 includes the cooling system 12d configured to receive cooling fluid through a pressurized enclosure 502 (e.g., plenum) located above a lowered ceiling 504. This embodiment operates in a similar manner to the embodiments illustrated in FIGS. 1, 2A–2B, 3A–3B, and 4A–4B. The difference between the embodiment illustrated in FIG. 5 and those embodiments is that the cooling fluid heated by the components in the racks 14a–14p is removed from above by returns 506a–506c. In addition, the return flow of cooling fluid may be varied by the operation of a controllable partition ("CP") 508. The CP 508 may be modulated by the operation of a motor 510 in a manner similar to the CP 26a–26f discussed above. In this manner, relatively warm air may be removed more efficiently. A more detailed description of the above-described embodiment may be found in co-pending U.S. application Ser. No. Not Yet Assigned, filed Oct. 3, 2002, which is assigned to the assignee of the present invention and is incorporated by reference herein in its entirety.

It should be understood that the vents 24a–24h operate to supply cooling fluid to the racks 14a–14p in much the same manner as that described hereinabove with respect to FIGS. 1, 2A–2B, 3A–3B, and 4A–4B. Therefore, the description set forth hereinabove with respect to the above-described embodiments are relied upon to provide a description of the embodiment illustrated in FIG. 5.

In accordance with an embodiment of the invention, the cooling requirements within a data center may be analyzed to substantially optimize the layout of the racks within zones of the data center. In one respect, the substantial optimization of the rack layout in the data center may enable the cooling system of the data center to operate at generally lower energy and greater efficiency levels by virtue of the reduced workload placed on the components of the cooling systems, e.g., compressors, fans, etc. The cooling requirements within the data center may be analyzed by operation of any reasonably suitable commercially available computational fluid dynamics (CFD) tool, e.g., FLOVENT, a 3-D modeling software capable of predicting temperature variations based upon fluid flows. By virtue of the numerical modeling, various air conditioning units as well as the vents described hereinabove may be positioned throughout the data center to substantially control the manner in which the racks receive the cooling fluid. In addition, the air conditioning units may also be positioned to substantially maximize and optimize their performances, e.g., to prevent one or more of the air conditioning units from being overworked.

In determining the cooling fluid distribution requirement within the data center, each of the racks may be assigned a heat load which may correspond to a maximum heat load predicted for that rack, e.g., through anticipated power draw. For example, a rack containing 40 subsystems, e.g., computers, may have a maximum heat load of 10 KW and a rack containing 20 subsystems may have a maximum heat load of 5 KW. By implementing the CFD in this manner, for example in a data center containing 100 racks and four air conditioning units, racks having a potential for relatively larger heat loads may be relatively separately located throughout the data center. In one respect, therefore, the air conditioning units within the data center may be operated at substantially legs than maximum power levels and the racks may receive sufficient amounts of cooling fluid. More specifically, the power required to operate the air conditioning units may be regulated to efficiently cool the fluid supplied to the racks by providing substantially only that amount of cooling fluid necessary to maintain the racks within normal operating temperatures.

According to another embodiment of the invention, a CFD tool may be implemented substantially continuously with the embodiments described hereinabove with respect to FIGS. 1–5. More specifically, the CFD tool may be utilized to substantially continuously vary the operation of the cooling system to operate according to the heat loads generated in the racks. In this regard, the anticipated or actual heat loads (e.g., based upon the power draw of the components) on the racks may be inputted into the CFD tool, along with one or more of the following properties: velocity of the cooling fluid flowing through various sections of the data center and the distribution of temperature and pressure of the cooling fluid in the data center, to determine an optimal manner in which the air conditioning units may be operated as well as the flow of the cooling fluid through the CPs to adequately cool the racks within each zone based upon an analysis of the data center layout and the heat loads. The CFD tool may be implemented to produce a numerical model of the data center to thus determine an optimized cooling distribution within the data center. A correlation of one or more of the following properties: velocity of the cooling fluid flowing through various zones of the data center, distribution of temperature and pressure of the cooling fluid in the data center, and the power draw into the racks, may be created based on the numerical modeling. The correlation may be used to infer thermal conditions throughout the data center when only a minimum number of sensors are available during operation of the cooling system. In addition, the correlation may substantially reduce the amount of time required for the CFD tool to perform the computing operations.

Thus, for example, with respect to FIG. 4A, at step 412, a numerical model may be created to analyze an optimal manner in which the volume flow and/or the velocity of the cooling fluid may be increased while considering the effects of fluid flow from other racks. In this respect, based upon the analysis, the CP supplying the respective zone and/or the vent supplying that rack with cooling fluid and/or another CP and/or vent may be caused to vary the volume flow and/or velocity of the cooling fluid. In addition, at step 414, the numerical model may be created to determine whether the cooling system output should be decreased based upon the heat loads and the fluid flow throughout the data center. For example, if it is determined that a rack with an increasing heat load may receive a sufficient amount of cooling fluid by receiving cooling fluid from a vent in another zone or generally away therefrom, the cooling system output may not be increased. Furthermore, the CFD tool may be utilized to analyze fluid flow characteristics in a situation in which a zone without a cooling system (e.g., zones 20*b*, 20*d*, 20*e*, and 20*f*) is generating a relatively greater amount of heat than adjacent zones.

In such a situation, the analysis may indicate a subset of the processing load be transferred. Alternatively or in addition, one or more vents within zones having a cooling system (e.g., zones 20*a*, 20*c*, 20*f*, and 20*h*) may be controlled to reduce the flow of fluid therethrough and thus, increase the available flow to zones in fluid communication. In this regard, as described generally hereinabove and in more detail within co-pending U.S. application Ser. No. 09/970,707, filed Oct. 5, 2001, which is assigned to the assignee of the present invention and is incorporated by reference herein in its entirety, the vents 24*a*–24*h* may be dynamically controllable.

Moreover, it is within the scope of the invention that a fan (not shown) in or near a CP 26*a*–26*f* be controlled to increase the flow of cooling fluid through an associated CP 26*a*–26*f*. Thus, by implementation of the CFD tool to generally analyze the fluid flow characteristics and the temperatures of the racks, the amount of energy required to sufficiently cool the racks within each of the zones in the data center may be substantially optimized.

By virtue of certain aspects of the invention, one of ordinary skill in the art will readily recognize that the amount of energy, and thus the costs associated with cooling the racks located within a data center may be substantially reduced. In one respect, by operating the cooling system to supply cooling fluid substantially only as needed by each respective zone, the cooling system may be operated at a relatively more efficient manner as compared to conventional cooling systems.

What has been described and illustrated herein is an embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method of cooling a plurality of racks in a data center, said method comprising:

activating a cooling device and opening a controllable partition configured to vary a supply of cooling fluid within a zone of said data center, said zone including at least one associated rack of said plurality of racks;

sensing the temperature of said at least one associated rack;

determining whether said sensed temperature is within a predetermined temperature range; and manipulating said controllable partition to vary said supply of said cooling fluid to said zone in response to said sensed temperature being outside said predetermined temperature range.

2. The method according to claim 1, further comprising:

determining whether the measured temperature of said at least one associated rack is below or equal to a predetermined minimum set point temperature; and decreasing the supply of said cooling fluid to said zone in response to said at least one associated rack having a measured temperature that falls below or equal said predetermined minimum set point temperature.

3. The method according to claim 1, further comprising:

sensing a pressure of a supply of said cooling fluid;

determining whether said sensed pressure is within a predetermined pressure range; and varying an output of said cooling device in response to said sensed pressure falling outside of said predetermined pressure range.

4. The method according to claim 2, further comprising:
increasing the supply of said cooling fluid to said zone in response to said at least one associated rack having a measured temperature that exceed said predetermined minimum set point temperature.

5. The method according to claim 3, wherein said step of varying said cooling device output includes determining whether said measured pressure falls below or equals a predetermined minimum set point pressure.

6. The method according to claim 4, further comprising:
decreasing an output of said cooling fluid from said cooling device in response to said decrease in cooling fluid supply to said zone exceeding said increase in cooling fluid supply to said zone.

7. The method according to claim 4, further comprising:
opening a plurality of vents, said vents being configured to supply cooling fluid to said racks;
controlling one or more of said plurality vents to decrease the supply of said cooling fluid to said at least one associated rack having a measured temperature that fall below or equal said predetermined minimum set point temperature; and
controlling said one or more vents to increase the supply of said cooling fluid to said at least one associated rack having a measured temperature that exceed said predetermined minimum set point temperature.

8. The method according to claim 4, further comprising:
opening a plurality of returns, said returns being configured to remove cooling fluid from various locations of said data center; and
controlling one or more of said plurality of returns to decrease the removal of said cooling fluid from around said at least one associated rack having a measured temperature that fall below or equal said predetermined minimum set point temperature; and
controlling said one or more returns to increase the removal of said cooling fluid from around said at least one associated rack having a measured temperature that exceed said predetermined minimum set point temperature.

9. The method according to claim 4, further comprising:
receiving temperatures from a movable device configured to detect at least one environmental condition at various locations of said data center;
determining whether at least one of said sensed temperatures and received temperatures are within a predetermined temperature range; and
manipulating said controllable partition to vary said supply of said cooling fluid to said zone in response to at least one of said sensed and received temperatures being outside of said predetermined temperature range.

10. The method according to claim 4, further comprising:
performing a numerical modeling of a temperature distribution and flow characteristics of the data center; and
manipulating said cooling device in response to said numerical modeling.

11. The method according to claim 5, further comprising:
increasing the output of said cooling device in response to said measured pressure falling below or equaling said predetermined minimum set point pressure.

12. The method according to claim 5, further comprising:
decreasing the output of said cooling device in response to said measured pressure exceeding said predetermined minimum set point pressure.

13. The method according to claim 6, further comprising:
increasing an output of said cooling fluid from said cooling device in response to said decrease in cooling fluid supply to said zone falling below said increase in cooling fluid supply to said zone.

14. The method according to claim 7, further comprising:
determining whether said at least one associated rack having a measured temperature that exceeds said predetermined minimum set point temperature is relatively downstream of the supply of said cooling fluid from said at least one associated rack having a measured temperature that fall below or equal said predetermined minimum set point temperature; and
controlling said one or more vents to decrease the supply of said cooling fluid to said at least one associated rack being relatively upstream of the supply of said cooling fluid and controlling said one or more vents to increase the supply of said cooling fluid to said at least one associated rack being relatively downstream of the supply of said cooling fluid in response to determining said at least one associated rack having a measured temperature that exceeds said predetermined minimum set point temperature is relatively downstream of the supply of said cooling fluid from said at least one associated rack having a measured temperature that fall below or equal said predetermined minimum set point temperature.

15. The method according to claim 10, further comprising:
implementing said numerical modeling to correlate at least two of temperature, velocity and pressure of said cooling fluid and power draw of at least one of said zone and said racks within said data center to thereby infer a thermal condition throughout said data center, wherein said manipulating step further comprises manipulating said cooling device in response to said inferred thermal condition.

16. A apparatus of cooling a plurality of racks in a data center, said apparatus comprising:
means for activating a cooling device and opening a controllable partition configured to vary a supply of cooling fluid within a zone of said data center, said zone including at least one associated rack of said plurality of racks;
means for sensing the temperature of said at least one associated rack;
means for determining whether said sensed temperature is within a predetermined temperature range; and
means for manipulating said controllable partition to vary said supply of said cooling fluid to said zone in response to said sensed temperature being outside said predetermined temperature range.

17. The apparatus according to claim 16, further comprising:
means for determining whether the measured temperature of said at least one associated rack is below or equal to a predetermined minimum set point temperature;
means for decreasing the supply of said cooling fluid to said zone in response to said at least one associated rack having a measured temperature that falls below or equal said predetermined minimum set point temperature; and
means for increasing the supply of said cooling fluid to said zone in response to said at least one associated rack having a measured temperature that exceed said predetermined minimum set point temperature.

18. The apparatus according to claim 16, further comprising:
   means for sensing a pressure of a supply of said cooling fluid;
   means for determining whether said sensed pressure is within a predetermined pressure range; and
   means for varying an output of said cooling device in response to said sensed pressure falling outside of said predetermined pressure range, wherein said step of varying said cooling device output includes determining whether said measured pressure falls below or equals a predetermined minimum set point pressure.

19. The apparatus according to claim 17, further comprising:
   decreasing an output of said cooling fluid from said cooling device in response to said decrease in cooling fluid supply to said zone exceeding said increase in cooling fluid supply to said zone; and
   means for increasing an output of said cooling fluid from said cooling device in response to said decrease in cooling fluid supply to said zone falling below said increase in cooling fluid supply to said zone.

20. The apparatus according to claim 17, further comprising:
   means for opening a plurality of vents, said vents being configured to supply cooling fluid to said racks;
   means for controlling one or more of said plurality vents to decrease the supply of said cooling fluid to said at least one associated rack having a measured temperature that fall below or equal said predetermined minimum set point temperature; and
   means for controlling said one or more vents to increase the supply of said cooling fluid to said at least one associated rack having a measured temperature that exceed said predetermined minimum set point temperature.

21. The apparatus according to claim 17, further comprising:
   means for opening a plurality of returns, said returns being configured to remove cooling fluid from various locations of said data center; and
   means for controlling one or more of said plurality of returns to decrease the removal of said cooling fluid from around said at least one associated rack having a measured temperature that fall below or equal said predetermined minimum set point temperature; and
   means for controlling said one or more returns to increase the removal of said cooling fluid from around said at least one associated rack having a measured temperature that exceed said predetermined minimum set point temperature.

22. The apparatus according to claim 17, further comprising:
   means for receiving temperatures from a movable device configured to detect at least one environmental condition at various locations of said data center;
   means for determining whether at least one of said sensed temperatures and received temperatures are within a predetermined temperature range; and
   means for manipulating said controllable partition to vary said supply of said cooling fluid to said zone in response to at least one of said sensed and received temperatures being outside of said predetermined temperature range.

23. The apparatus according to claim 17, further comprising:
   means for performing a numerical modeling of a temperature distribution and flow characteristics of the data center; and
   means for manipulating said cooling device in response to said numerical modeling.

24. The apparatus according to claim 18, further comprising:
   means for increasing the output of said cooling device in response to said measured pressure falling below or equaling said predetermined minimum set point pressure; and
   means for decreasing the output of said cooling device in response to said measured pressure exceeding said predetermined minimum set point pressure.

25. The apparatus according to claim 20, further comprising:
   means for determining whether said at least one associated rack having a measured temperature that exceeds said predetermined minimum set point temperature is relatively downstream of the supply of said cooling fluid from said at least one associated rack having a measured temperature that fall below or equal said predetermined minimum set point temperature; and
   means for controlling said one or more vents to decrease the supply of said cooling fluid to said at least one associated rack being relatively upstream of the supply of said cooling fluid and controlling said one or more vents to increase the supply of said cooling fluid to said at least one associated rack being relatively downstream of the supply of said cooling fluid in response to determining said at least one associated rack having a measured temperature that exceeds said predetermined minimum set point temperature is relatively downstream of the supply of said cooling fluid from said at least one associated rack having a measured temperature that fall below or equal said predetermined minimum set point temperature.

26. The apparatus according to claim 23, further comprising:
   means for implementing said numerical modeling to correlate at least two of temperature, velocity and pressure of said cooling fluid and power draw of at least one of said zone and said racks within said data center to thereby infer a thermal condition throughout said data center, wherein said manipulating step further comprises manipulating said cooling device in response to said inferred thermal condition.

27. A cooling system for cooling racks in a data center, said system comprising:
   a cooling device for supplying cooling fluid to said racks, said cooling device including a fan;
   a plenum for conveying said cooling fluid to said racks, said plenum being in fluid communication with said fan; and
   a controllable partition located within said plenum, wherein pressure of said cooling fluid in said plenum is controlled by modulation of said partition.

28. The system according to claim 27, wherein said plenum includes a divider operable to divide said plenum into a first chamber and a second chamber, wherein said first chamber is in fluid communication with said cooling device and at least one of said first chamber and said second chamber is in fluid communication with said controllable partition, and wherein said divider operates to maintain the pressure of said cooling fluid in said second chamber at a substantially uniform pressure.

29. The system according to claim 27, wherein said controllable partition is comprised of a plurality of louvers operable to adjust from fully open to fully closed.

30. The system according to claim 27, wherein said controllable partition is operable to rotate.

31. The system according to claim 27, wherein said controllable partition is operable to retract and elongate.

32. The system according to claim 27, further comprising:
a return plenum having a plurality of returns and an outlet, wherein said outlet of said return plenum is in fluid communication with said fan, wherein said plurality of returns are configured for removing said cooling fluid from said data center and are operable to vary a characteristic of said removal of cooling fluid through said returns; and
at least one return controller operable to control at least one of said returns, wherein said at least one return controller is configured to substantially independently control said returns to thereby substantially independently vary said characteristic of said cooling fluid removal.

33. The system according to claim 27, further comprising:
a plurality of vents for delivering said cooling fluid to said racks, wherein said vents are operable to vary a characteristic of said cooling fluid delivered through each of said vents; and
at least one vent controller operable to control at least one of said vents, wherein said at least one vent controller is configured to independently control said vents to thereby independently vary said characteristic of said cooling fluid.

34. The system according to claim 27, further comprising:
a baffle positioned within said plenum for generating substantially laminar flow of said cooling fluid.

35. The system according to claim 27, further comprising a sensor for measuring an environmental condition, wherein a characteristic of said supply of cooling fluid is modified in response to said measured environmental condition, said characteristic of said cooling fluid including at least one of volume flow rate and velocity, and said environmental condition including at least one of temperature, pressure, air flow, and humidity.

36. The system according to claim 34, wherein said baffle is further configured to control the direction of flow of said cooling fluid and the system further comprises:
a controller operable to control said baffle, wherein said controller is configured to control said baffle to vary the direction of flow of said cooling fluid.

37. The system according to claim 35, further comprising:
a plurality of controllable partitions configured to subdivide said plenum into a plurality of zones; and
at least one controllable partition controller operable to control at least one of said controllable partitions, wherein said at least one controllable partition controller is configured to independently control said controllable partitions to thereby independently vary said characteristic of said cooling fluid.

38. The system according to claim 37, wherein said sensor comprises a plurality of sensors configured to measure said environmental condition of said racks and said at least one controllable partition controller is configured to independently control said controllable partitions in response to said measured environmental condition at each of said racks.

39. The system according to claim 37, wherein said at least one controllable partition controller is operable to independently control each of said controllable partitions on the basis of an anticipated amount of heat predicted to be generated by each of said racks.

40. The system according to claim 37, further comprising:
a cooling device controller operable to control said supply of cooling fluid from said cooling device in response to signals received from said at least one controllable partition controller and thereby vary the cooling fluid supply in said plenum.

41. The system according to claim 37, further comprising a mobile device having said sensor and configured to navigate said data center and relay data associated with said environmental conditions to said at least one controllable partition controller.

* * * * *